United States Patent
Bartholomew et al.

(10) Patent No.: US 7,400,135 B1
(45) Date of Patent: Jul. 15, 2008

(54) TEST FIXTURE AND METHOD FOR CIRCUIT BOARD TESTING

(75) Inventors: Mark R. Bartholomew, Chino Hills, CA (US); Richard Leonard, Santa Ana, CA (US); Thomas Wohlhieter, Fontana, CA (US)

(73) Assignee: Quality One Test Fixturing, Inc., Ontario, CA (US)

( * ) Notice: Subject to any disclaimer, the term of this patent is extended or adjusted under 35 U.S.C. 154(b) by 0 days.

(21) Appl. No.: 11/710,020

(22) Filed: Feb. 23, 2007

(51) Int. Cl.
*G01R 31/28* (2006.01)
*G01R 31/02* (2006.01)

(52) U.S. Cl. .................... 324/158.1; 324/755

(58) Field of Classification Search ............ 324/158.1, 324/207.13, 754–765
See application file for complete search history.

(56) References Cited

U.S. PATENT DOCUMENTS

| | | | | |
|---|---|---|---|---|
| 2,918,648 A | * | 12/1959 | Ludman et al. | 439/711 |
| 4,357,062 A | * | 11/1982 | Everett | 439/54 |
| 4,506,184 A | * | 3/1985 | Siddall | 310/328 |
| 5,270,641 A | * | 12/1993 | Van Loan et al. | 324/757 |
| 5,311,120 A | | 5/1994 | Bartholomew | |
| 5,572,144 A | * | 11/1996 | Davidson et al. | 324/755 |
| 5,574,668 A | * | 11/1996 | Beaty | 702/150 |
| 5,894,225 A | * | 4/1999 | Coffin | 324/762 |
| 6,084,422 A | | 7/2000 | Bartholomew | |
| 6,307,386 B1 | * | 10/2001 | Fowler et al. | 324/754 |
| 6,650,135 B1 | * | 11/2003 | Mautz et al. | 324/765 |
| 6,667,628 B2 | * | 12/2003 | Ahrikencheikh et al. | 324/754 |
| 6,917,212 B2 | * | 7/2005 | Zhao et al. | 324/755 |

\* cited by examiner

*Primary Examiner*—Ha Tran Nguyen
*Assistant Examiner*—Joshua Benitez
(74) *Attorney, Agent, or Firm*—Kenneth L. Green; Edgar W. Averill, Jr.

(57) ABSTRACT

A Printed Circuit Board (PCB) test fixture includes flex sensors for monitoring the flex (or distortion) of the PCB during testing. The PCB is positioned above irregular array of test probes. The test probes are aligned with electrical test points on the PCB. The PCB is then pressed downward against the test probes by an irregular array of pushers. The positions of the pushers are generally specified by a PCB manufacturer to avoid PCB elements and the positions of the test probes are generally specified by the PCB manufacturer to obtain desired signals.

18 Claims, 7 Drawing Sheets

TEST FIXTURE AND METHOD FOR CIRCUIT BOARD TESTING

BACKGROUND OF THE INVENTION

The present invention relates to fixtures for testing Printed Circuit Boards (PCBs) and in particular to a test fixture which includes strain gauges to measure the deflection of the PCB when test contacts are pressed against the PCB.

The manufacture of PCBs often includes testing the electrical functionally of the PCB. Such testing may be performed by resting the PCB in a test fixture, and pressing test probe contacts against PCB circuit traces on the PCB. Such test fixtures are described in U.S. Pat. No. 5,311,120 for "TEST FIXTURE WITH TEST FUNCTION FEATURE" and in U.S. Pat. No. 6,084,422 for "PRINTED CIRCUIT BOARD TESTING DEVICE", both inventions by one of the present applicants. Although the know test fixtures have provided means for testing PCBs, in some instances, enough force is applied to the PCB by the test contacts to damage the PCB. The '120 patent and the '422 patent are herein incorporated by reference.

BRIEF SUMMARY OF THE INVENTION

The present invention addresses the above and other needs by providing a Printed Circuit Board (PCB) test fixture which includes flex sensors for monitoring the flex (or distortion) of the PCB during testing. The PCB is positioned above irregular array of test probes. The test probes are aligned with electrical test points on the PCB. The PCB is then pressed downward against the test probes by an irregular array of pushers. The positions of the pushers are generally specified by a PCB manufacturer to avoid PCB elements and the positions of the test probes are generally specified by the PCB manufacturer to obtain desired signals.

In accordance with one aspect of the invention, there is provided a test fixture including an array of test probes, an array of pushers, and an array of flex sensors. The support plate provides support for a PCB during a PCB test. A base plate resides under the support plate and holds the test probes. A gate is lowerable over the support plate to compress the support plate from a relaxed position to a compressed position a during the PCB test. The array of electrical test probes is attached to the base plate for making electrical contact with circuits on the PCB when the base plate is in the compressed position during the PCB test. A push plate attached to the gate and the array of pushers is attached to the push plate for pushing the PCB against the test probes during the PCB test. A ridged flex sensor plate is attached to the gate and isolated from flexing of the push plate during the PCB test and the array of flex sensors are attached to the test fixture for measuring deflections of the PCB during the PCB test.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
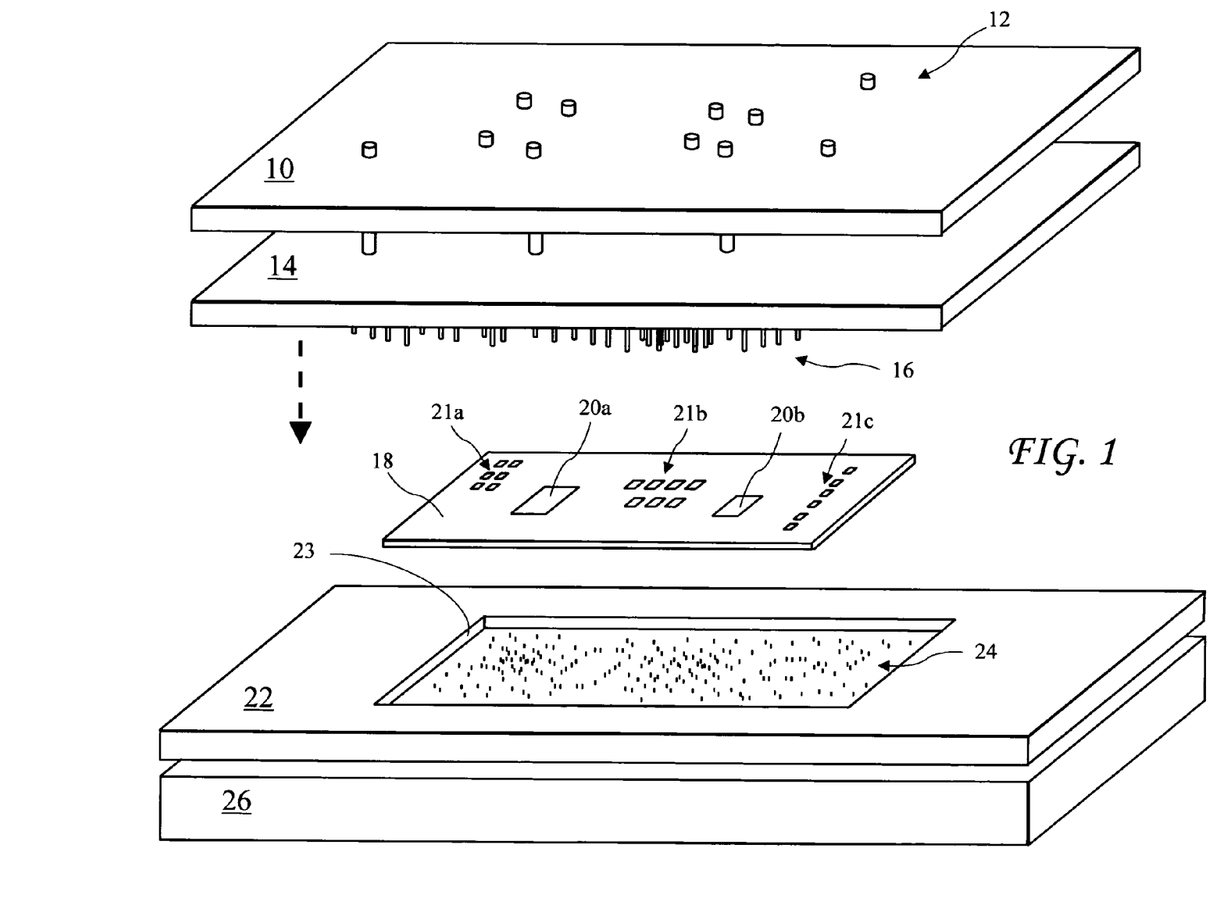
FIG. 1 is an exploded view of several elements of a Printed Circuit Board (PCB) testing fixture according to the present invention.

An exploded view of several elements of a Printed Circuit Board (PCB) testing fixture according to the present invention and a PCB 18 are shown in FIG. 1. The PCB testing fixture includes a flex sensor plate 10 holding a multiplicity of flex sensors 12, a push plate 14 holding a multiplicity of pushers 16, a support plate 22 for supporting the PCB 18 during testing, a multiplicity of test probes 24 exposeable through a support plate recess 23 when the support plate 22 is in a compressed (or down) position, and a base plate 26 supporting the support plate 22. A gate 28 (not shown in FIG. 1, see FIGS. 2 and 3) reside above the support plate 22 and supports the flex sensor plate 10 and the push plate 14. The PCB 18 resides between the pushers 16 and the test probes 24 during PCB testing. The PCB 18 includes large components 20a and 20b, and groups of small components 21a, 21b, and 21c. The flex sensor plate 10 is a ridged flex sensor plate decoupled from flexing of the push plate 14 during PCB testing to provide accurate flex measusrments. Examples of known test fixtures not including the flex sensors 12 of the present invention are described in U.S. Pat. No. 5,311,120 for "TEST FIXTURE WITH TEST FUNCTION FEATURE" and in U.S. Pat. No. 6,084,422 for "PRINTED CIRCUIT BOARD TESTING DEVICE", both inventions by one of the present applicants and incorporated by reference above.

Figure 2:
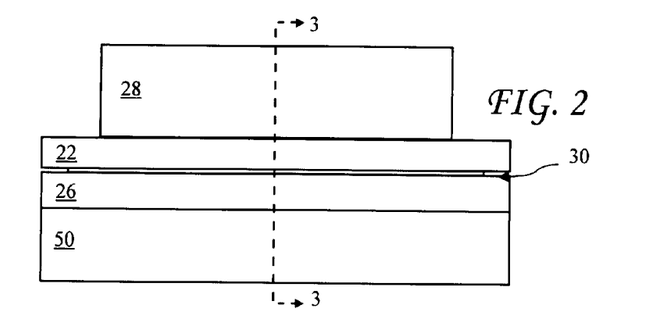
FIG. 2 depicts an end view of the PCB testing fixture
Figure 3A:
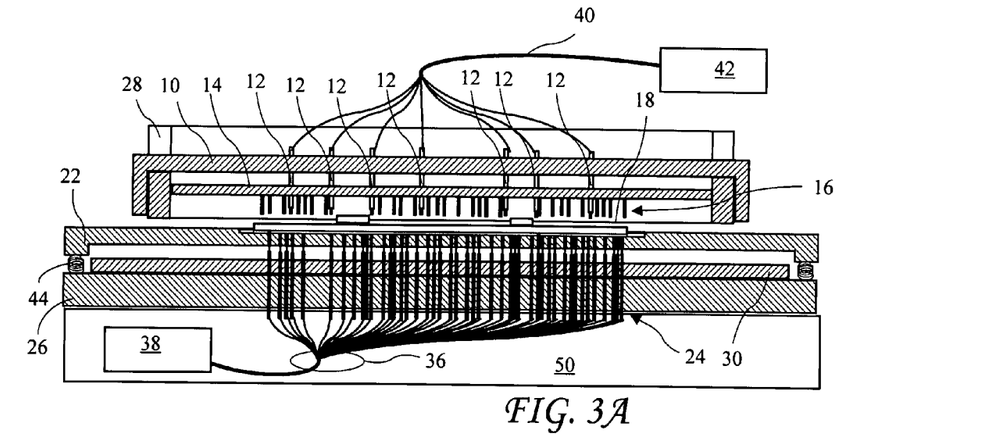
FIG. 3A is a cross-sectional view of the PCB testing fixture taken along line 3-3 of FIG. 2 with a test fixture gate slightly raised.

An end view of the PCB testing fixture is shown in FIG. 2. A cross-sectional view of the PCB testing fixture taken along line 3-3 of FIG. 2 with the PCB 18 in a PCB test position and a test fixture gate 28 slightly raised and the support plate 22 in a relaxed position is shown in FIG. 3A. The PCB lies on the support plate 22 and the support plate recess 23 (see FIG. 1) preferably is shaped to match a lower surface of the PCB 18. The flex sensor plate 10 and the push plate 14 are fixedly attached to the gate 28 and move vertically with the gate 28. The flex sensor plate 10 holds the flex sensors 12 in a precise position relative to the gate 28 for making precise measurement of deflection of the PCB 18 under test, and the flex sensor plate 10 is sufficiently ridged to permit highly accurate measurements to be made by the flex sensors 12, for example, to within approximately 0.001 inches, and if necessary the flex sensor plate 10 may be made sufficiently ridged to measure within approximately 0.0001 inches. The flex sensors 12 pass through the push plate 14, but preferably are not coupled with the push plate 14 which may experience some deflection during use of the test fixture, thereby isolating the flex sensors 12 from the pushers 16. During PCB testing, the gate 28, the flex sensor plate 10, and the push plate 14 are moved downward towards the PCB, either by mechanical means, vacuum or by air pressure. Examples of mechanisms for moving the gate 28 are described in U.S. Pat. No. 5,311,120 for "TEST FIXTURE WITH TEST FUNCTION FEATURE" and in U.S. Pat. No. 6,084,422 for "PRINTED CIRCUIT BOARD TESTING DEVICE", both inventions by one of the present applicants and incorporated by reference above. The mechanical means include, for example, levers, threaded shafts, linear motors, and the like.

Figure 3B:
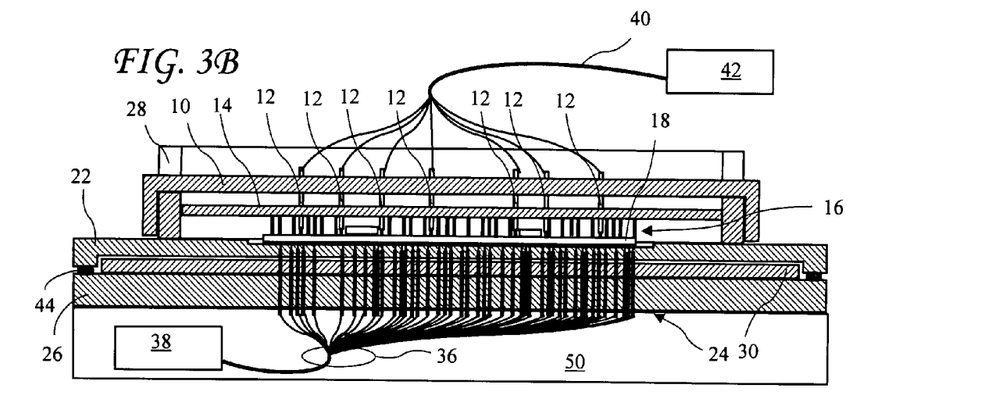
FIG. 3B is a cross-sectional view of the PCB testing fixture taken along line 3-3 of FIG. 2 with the test fixture gate fully lowered.

The test probes 24 extend upwards from the base plate 26 and through the insert 30. The insert 30 is provided to add horizontal support to the test probes A cross-sectional view of the PCB testing fixture taken along line 3-3 of FIG. 2 with a test fixture gate 28 lowered and the support plate 22 in a compressed position is shown in FIG. 3B. The support plate 22 is normally biased away from the base plate 26, but during testing, the support plate 22 is pushed toward the base plate 26 by the gate 28. During PCB testing, the pushers 16 push the PCB 18 downward against the test probes 24, and the flex sensors 12 measure the deflection of specified points on the PCB 18. Test probe cables 36 connect the test probes 24 to test probe interface electronics 38 residing in a tester interface box 50. Flex sensor cables 40 connect the flex sensors to a flex sensor interface electronics 42.

Figure 4A:
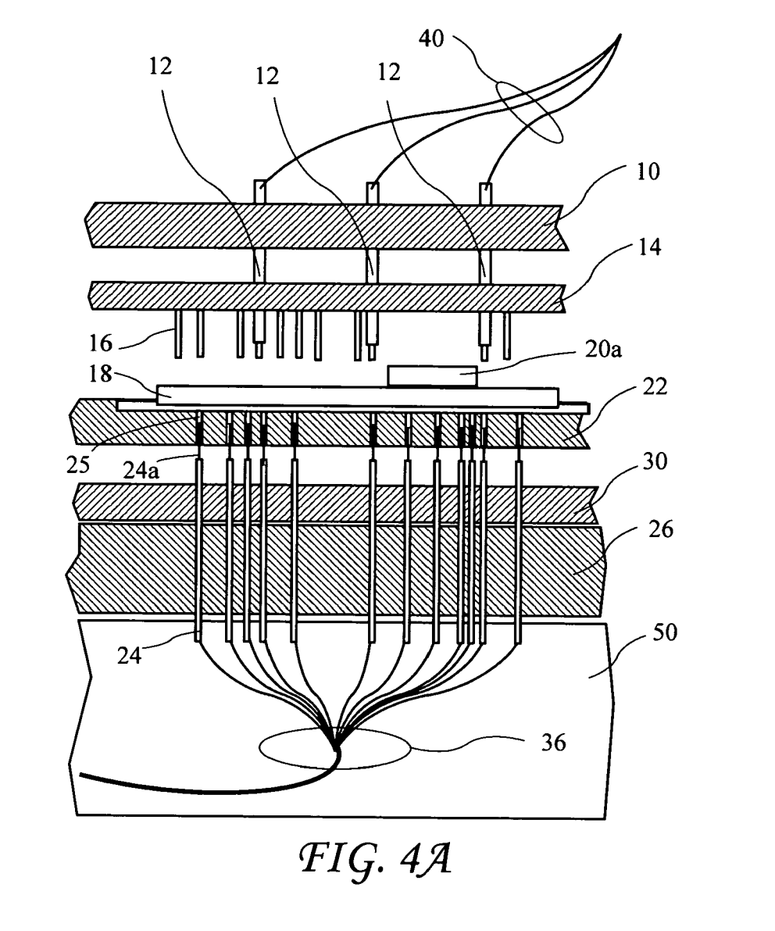
FIG. 4A is a more detailed cross-sectional view of a portion of the PCB testing fixture taken along line 3-3 of FIG. 2 with a test fixture gate slightly raised.
Figure 4B:
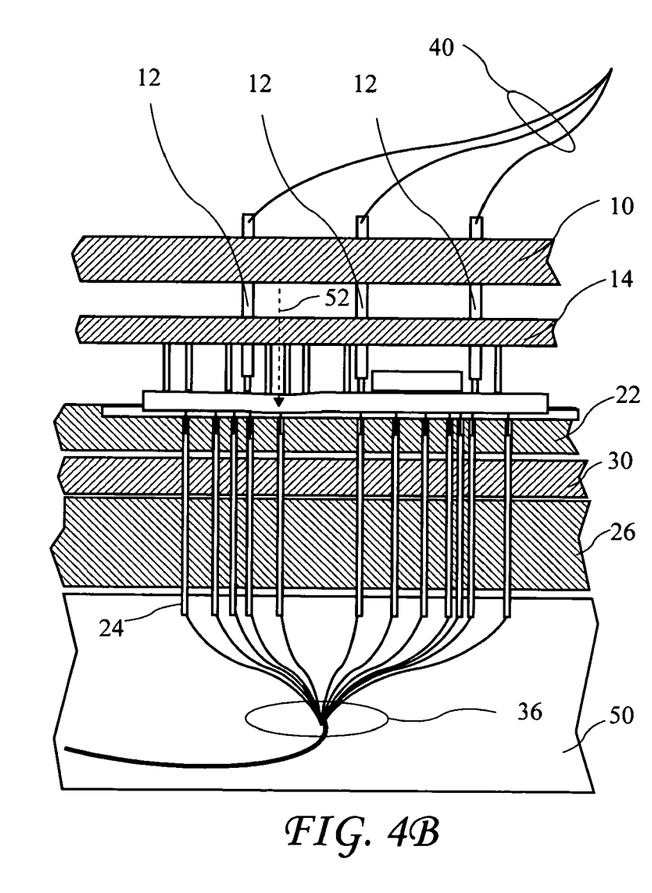
FIG. 4B is a more detailed cross-sectional view of a portion of the PCB testing fixture taken along line 3-3 of FIG. 2 with the test fixture gate fully lowered.

A more detailed cross-sectional view of a portion of the PCB testing fixture taken along line 3-3 of FIG. 2 with a test fixture gate 28 slightly raised is shown in FIG. 4A, and a more detailed cross-sectional view of a portion of the PCB testing fixture taken along line 3-3 of FIG. 2 with the test fixture gate 28 fully lowered is shown in FIG. 4B. The test probes 24 include probe contacts 24a. When the gate 28 is raised, the test probe contact 24a reside in passages 25 in the support plate 22. When the gate 28 is lowered against the support plate 22, the support plate is pushed lower and against the insert 30. The contacts 24a extend through the lowered support plate 22 and make electrical contact with circuit elements of the PCB 18 to allow electrical testing. The pushers 16 push the PCB 18 downward against the contacts 24a to balance the vertical forces on the PCB 18. In most instances, the vertical forces on the PCB are not balanced, and the PCB flexes as show at arrow 52. In these instances, the flex sensors 12 may measure the amount of flex of the PCB 18 and provide a warning before the PCB 18 is damages. The flex sensor measurements of the PCB 18 are generally of a vertical deflection of the PCB 18. The data from the flex sensors 12 may further be utilized to adjust the positions of the pushers 16 to better balance the vertical forces on the PCB 18.

Figure 4C:
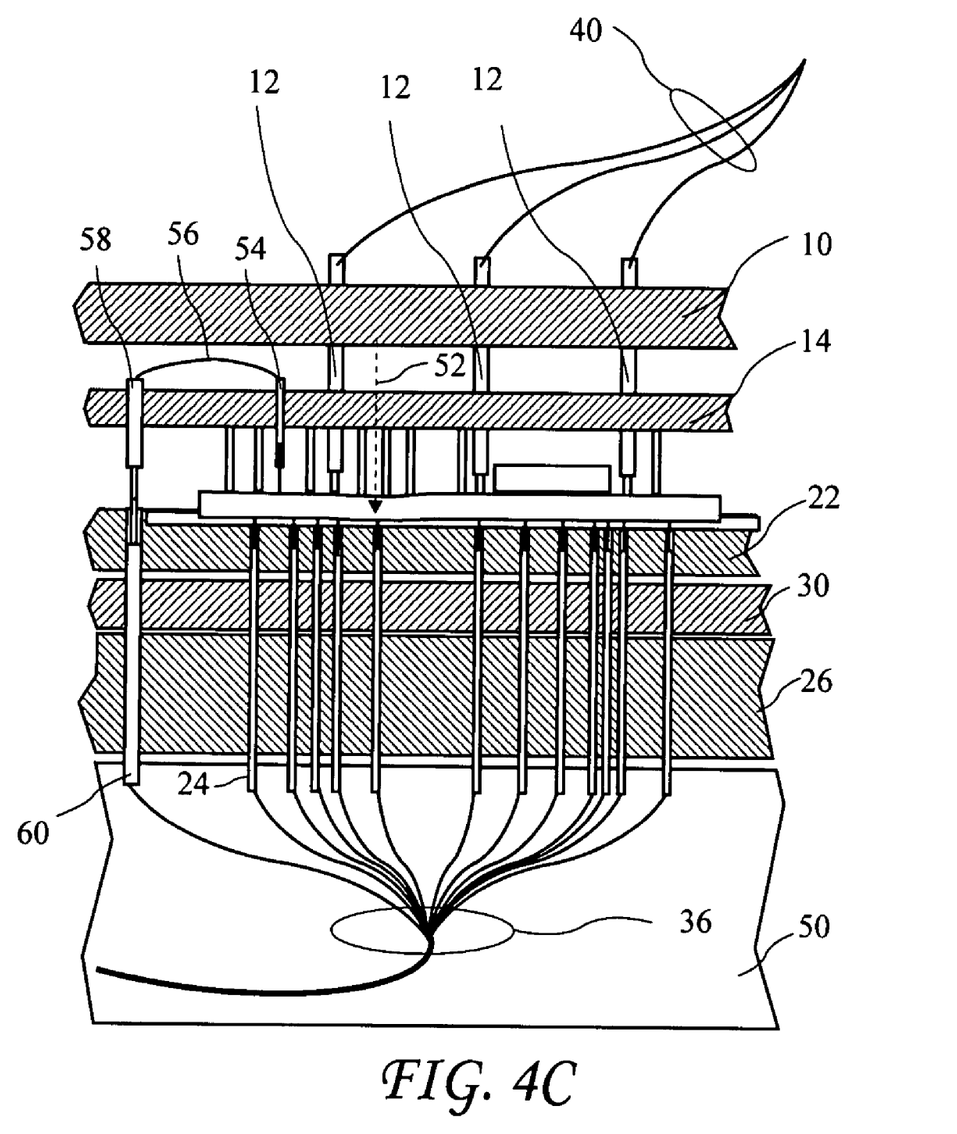
FIG. 4C is an embodiment of the present invention including additional probes above the PCB.

An embodiment of the present invention including an additional test probe 54 mounted in the push plate 14 above the PCB 18 is shown in FIG. 4C. The probe 54 are connected by a second test probe cable 56 to an upper probe connector 58. The upper probe connector 58 is also mounted in the push plate 14. A lower probe connector 60 is similarly to the mounting of the test probes 24, and makes an electrical connection with the upper probe connector 58 when the gate 28 is lowered for PCB 18 testing. An additional lead 36 connects the lower probe connector to the test probe interface electronics 38.

Figure 5:
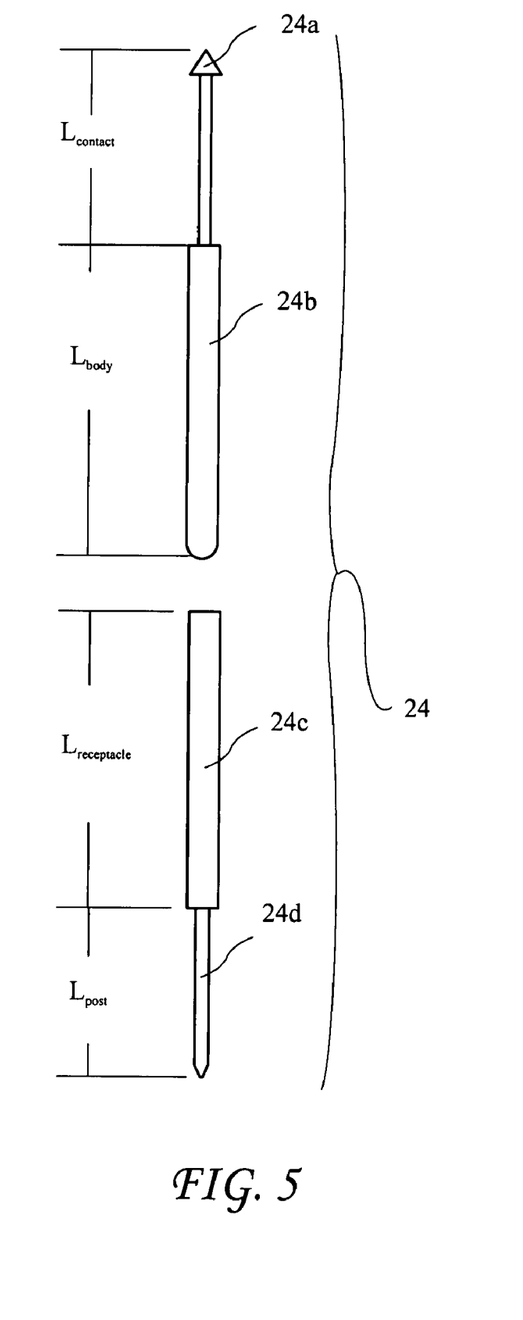
FIG. 5 is a test probe according to the present invention.

A detailed view of the test probe 24 according to the present invention is shown in FIG. 5. The test probe 24 includes the contact 24a, probe body 24b, probe receptacle 24C and wire post 24d. A spring resides in the probe body 24b to bias the contact 24a against the PCB 18. The probe contact 24a and probe body 24b are removeable and replaceable from the probe receptacle 24c for service and repair. The probe receptacle 24c is preferably permanently mounted to the base plate 26 (see FIGS. 4A-4C) and extends into the insert 30 for stability. The contact 24a has a contact length $L_{contact}$, the body 24b has a body length $L_{body}$, the receptacle 24c has a receptacle length $L_{receptacle}$, and the post 24d has a post length $L_{post}$. The contact length $L_{contact}$ is preferably approximately 0.31 inches, the body length $L_{body}$ is preferably approximately one inch, the receptacle length $L_{receptacle}$ is preferably approximately 1.01 inches, and the post length $L_{post}$ is preferably approximately 0.69 inches. The contact 24a is generally made from silver or nickel and gold plated for conductivity.

Figure 6:
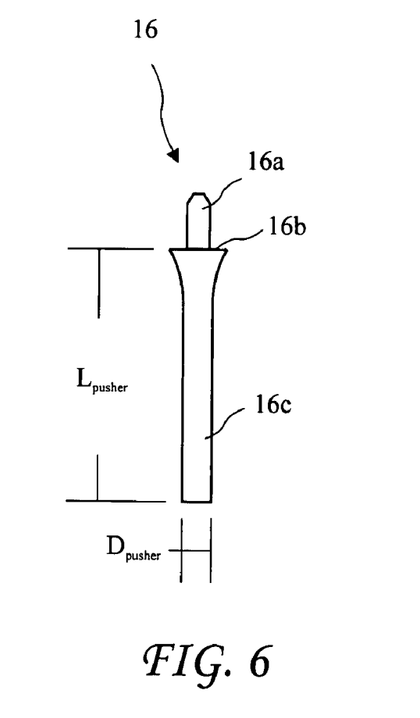
FIG. 6 is a pusher.

A detailed view of the pusher 16 is shown in FIG. 6. The Pusher 16 has an insertion end 16a, a stop 16b, and a contact end 16c. The insertion end 16a is inserted into the push plate 14 (see FIGS. 4A-4C) up to the stop 16b. The contact end 16c a contact length $L_{contact}$ and a contact diameter $D_{contact}$. The contact length $L_{contact}$ is preferably approximately 0.687 inches and the contact diameter is preferably approximately 0.10 inches. The pusher is made from a hard rubber or plastic or of material with like physical characteristics.

Figure 7:
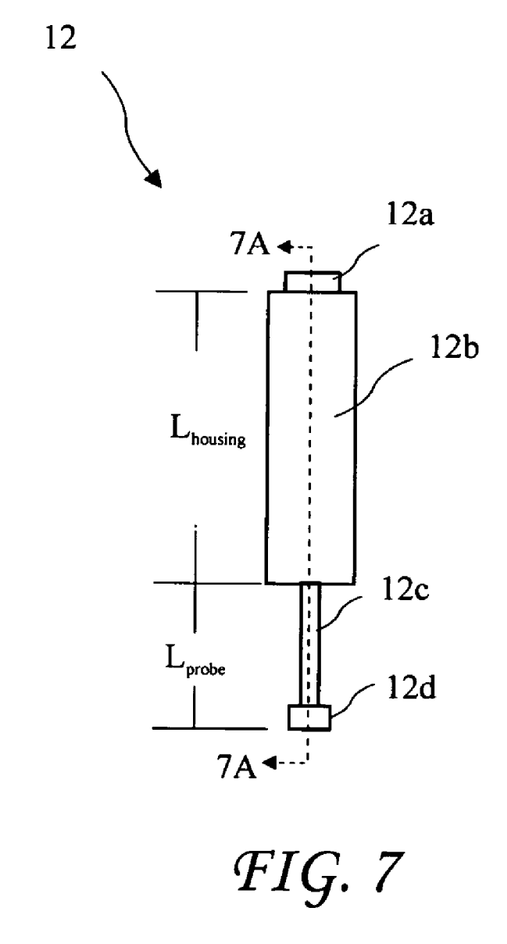
FIG. 7 is a flex sensor according to the present invention.

A detailed view of the flex sensor 12 according to the present invention is shown in FIG. 7. The flex sensor includes a flex sensor electrical connector 12a, a flex sensor housing 12b, and a probe comprising a moveable shaft 12c and a flex sensor foot 12d. The housing 12b has a housing length $L_{housing}$ and a probe has a probe length $L_{probe}$. The probe length $L_{probe}$ is a vertical distance from the base of the housing 12b to the base of the foot 12d when the probe is relaxed with no vertical forces on the probe. The housing length $L_{housing}$ is preferably approximately 2.25 inches and the probe length $L_{probe}$ is preferably approximately one inch.

Figure 7A:
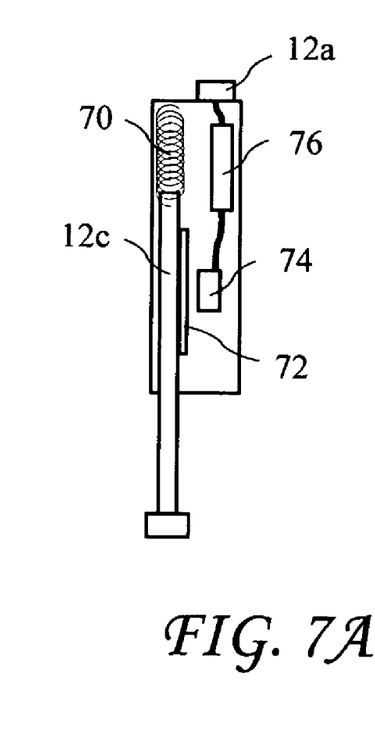
FIG. 7A is a cross-sectional view of the flex sensor taken along line 7A_7A of FIG. 7.

A cross-sectional view of the flex sensor 12 taken along line 7A_7A of FIG. 7 is shown in FIG. 7A. The flex sensor 12 includes a spring 70 biasing the moveable shaft 12c out of the body 12b, a scale 72 attached to and moving with the moveable shaft 12c, a measurement encoder 74 for measuring motion of the scale 72, and electronics 76 for generating a flex sensor output signal. An example of a suitable scale 72 is a model #L18CE from MicroE Systems in Natick. Mass. An example of a suitable encoder chip is a model # CE-4 from MicroE Systems. An example of suitable electronics 76 is an 18F2431 made by Microchip in Chandler, Ariz. combined with misc resistors and capacitors.

Figure 8:
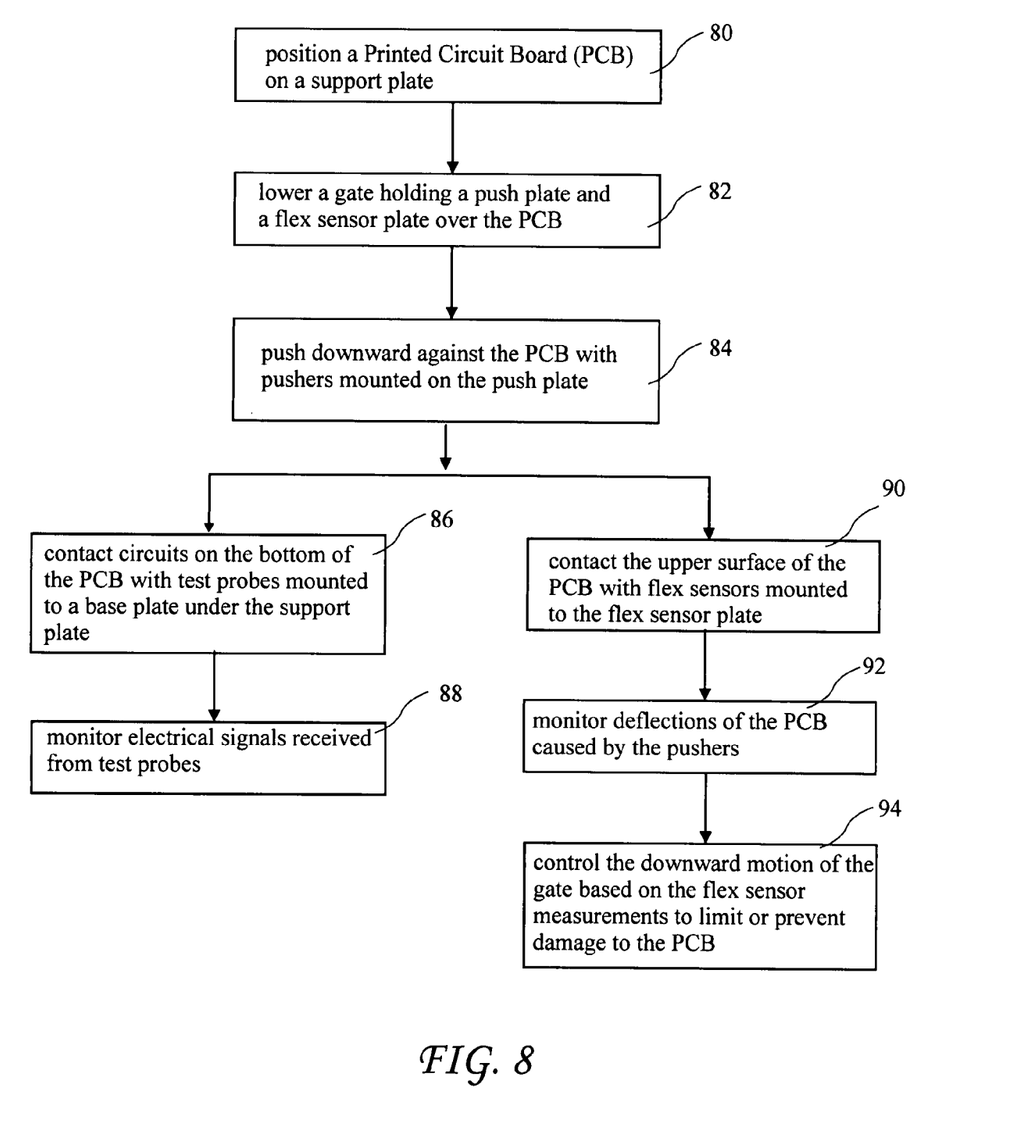
FIG. 8 is a method according to the present invention.

A method for testing PCBs according to the present invention is described in FIG. 8. The method includes positioning a PCB on a support plate at step 80. Lowering a gate holding a push plate and a flex sensor plate over the PCB at step 82. Pushing downward against the PCB with pushers mounted on the push plate at step 84. Contacting circuits on the bottom of the PCB with test probes mounted to a base plate under the support plate at step 86. Monitoring electrical signals received from test probes at step 88. Contacting an upper surface of the PCB with flex sensors mounted to the flex sensor plate at step 90. Monitoring deflections of the PCB caused by the pushers at step 92, and controlling the downward motion of the gate based on the flex sensor measurements to limit or prevent damage to the PCB at step 94. The steps 86 and 88 may be performed simultaneous with steps 90, 92, and 94 to monitor deflections of the PCB during electrical testing, or the steps 90, 92, and 94 may be performed prior to electrical testing to obtain limits on downward pushing by the pushers.

While the invention herein disclosed has been described by means of specific embodiments and applications thereof, numerous modifications and variations could be made thereto by those skilled in the art without departing from the scope of the invention set forth in the claims.

We claim:

1. A Printed Circuit Board (PCB) test fixture comprising:
   a support for positioning a PCB being PCB tested in a PCB test position;
   at least one electrical test probe positioned with respect to the PCB test position for making electrical contact with circuits on the PCB positioned by the support plate during the PCB testing;
   at least one pusher positionable with respect to the PCB test position for urging the PCB against the test probes during the PCB testing; and
   at least one flex sensor attached to a flex sensor plate lowerable over the PCB test position for measuring deflections of the PCB during the PCB testing.

2. The test fixture of claim 1, wherein:
   the at least one electrical test probe is positioned below the PCB test position;
   the at least one pusher is positionable above the PCB test position for testing the PCB; and
   the at least one flex sensor is positionable above the PCB test position for testing the PCB.

3. The test fixture of claim 2, wherein the support is a support plate for carrying the PCB during testing.

4. The test fixture of claim 3, wherein the support plate has a relaxed position biased away from the test probes wherein a PCB resting on the support plate separated from the test probes, and the support plate has a compressed position towards the test probes wherein the PCB is in electrical contact with the test probes.

5. The test fixture of claim 4, further including a gate lowerable over the support plate during the PCB testing, the gate carrying the at least one pusher.

6. The test fixture of claim 5, wherein the at least one pusher comprises an array of pushers held by a push plate attached to the gate and lowerable over the support plate by the gate during the PCB testing.

7. The test fixture of claim 6, wherein the at least one flex sensor comprises an array of flex sensors held by the flex sensor plate attached to the gate and lowerable over the support plate by the gate during the PCB testing.

8. The test fixture of claim 7, wherein the array of flex sensors are positioned outside a PCB element footprint near corners of the PCB element footprint.

9. The test fixture of claim 6, wherein the flex sensor plate is a ridged flex sensor plate decoupled from flexing of the push plate during the PCB testing.

10. The test fixture of claim 9, wherein the flex sensor plate is sufficiently ridged to permit measurements to be made by the flex sensors to an accuracy within approximately 0.001 inches.

11. The test fixture of claim 9, wherein the gate is hinged to allow lowering the gate over the support plate during the PCB testing.

12. The test fixture of claim 9, further including at least one additional test probe attached to the push plate to electrically connect with a test point on a top surface of the PCB during the PCB testing.

13. The test fixture of claim 9, wherein the array of flex sensors are positioned in the flex sensor plate at flex test points specified by a PCB manufacturer.

14. A Printed Circuit Board (PCB) test fixture comprising:
    a support plate for supporting a PCB during a PCB test;
    a base plate residing under the support plate;
    an array of electrical test probes attached to the base plate for making electrical contact with circuits on the PCB during the PCB test;
    a gate lowerable over the support plate during the PCB test;
    a push plate attached to the gate;
    an array of pushers attached to the push plate for pushing the PCB against the test probes during the PCB test:
    a flex sensor plate attached to the gate; and
    at least one flex sensor attached to the flex sensor plate to measure deflections of the PCB during the PCB test.

15. The test fixture of claim 14, wherein the at least one flex sensor comprises an array of flex sensors positioned in the flex sensor plate at flex test points specified by a PCB manufacturer.

16. The test fixture of claim 15, wherein the array of flex sensors are positioned outside a PCB element footprint near corners of the PCB element footprint.

17. A Printed Circuit Board (PCB) test fixture comprising:
    a compressible support plate for supporting a PCB during a PCB test;
    a base plate residing under the support plate;
    a gate lowerable over the support plate to compress the support plate from a relaxed position to a compressed position a during the PCB test;
    an array of electrical test probes attached to the base plate for making electrical contact with circuits on the PCB when the base plate is in the compressed position during the PCB test;
    a push plate attached to the gate;
    an array of pushers attached to the push plate for pushing the PCB against the test probes during the PCB test:
    a ridged flex sensor plate attached to the gate and isolated from flexing of the push plate during the PCB test; and
    an array of flex sensor attached to the flex sensor plate for measuring vertical deflections of the PCB during the PCB test.

18. A method for testing a Printed Circuit Board, the method comprising:
    positioning a PCB on a support plate;
    lowering a gate holding a push plate and a flex sensor plate over the PCB;
    pushing downward against the PCB with pushers mounted on the push plate;
    contacting circuits on the bottom of the PCB with test probes mounted to a base plate under the support plate;
    monitoring electrical signals received from test probes;
    contacting an upper surface of the PCB with flex sensors mounted to the flex sensor plate;
    monitoring deflections of the PCB caused by the pushers;
    and controlling the downward motion of the gate based on the flex sensor measurements to limit or prevent damage to the PCB.

* * * * *